United States Patent [19]

Florence et al.

[11] 3,998,668

[45] Dec. 21, 1976

[54] ALUMINUM METAPHOSPHATE DOPANT SOURCES

[75] Inventors: Jack M. Florence; William E. Smith, both of Sylvania, Ohio

[73] Assignee: Owens-Illinois, Inc., Toledo, Ohio

[22] Filed: Mar. 18, 1976

[21] Appl. No.: 667,939

Related U.S. Application Data

[60] Continuation of Ser. No. 427,380, Dec. 21, 1973, abandoned, which is a division of Ser. No. 305,548, Nov. 10, 1972, Pat. No. 3,841,927.

[52] U.S. Cl. .................................. 148/22; 148/186; 148/187; 148/188; 148/189; 423/305; 423/311; 423/314; 106/57; 106/54; 106/52; 252/950; 252/951
[51] Int. Cl.² ..................................... H01L 21/225
[58] Field of Search ............ 148/22, 186, 187, 188, 148/189; 423/305, 311, 314; 106/57, 54, 52; 252/950, 951

[56] References Cited

UNITED STATES PATENTS

| | | | |
|---|---|---|---|
| 3,314,833 | 4/1967 | Arndt et al. .................. | 148/189 |
| 3,530,016 | 9/1970 | Joseph .......................... | 148/189 |
| 3,540,895 | 11/1970 | Scheidler et al. ............. | 106/39 |
| 3,751,309 | 8/1973 | Derick et al. ................. | 148/171 |

FOREIGN PATENTS OR APPLICATIONS

| | | | |
|---|---|---|---|
| 504,835 | 8/1954 | Canada ............................... | 423/405 |

*Primary Examiner*—G. Ozaki
*Attorney, Agent, or Firm*—C. S. Lynch; E. J. Holler

[57] ABSTRACT

A solid source consisting essentially of high purity aluminum metaphosphate, $Al(PO_3)_3$ is used for introducing elemental phosphorus into P-type silicon chips or wafers of semi-conductor grade. The aluminum metaphosphate functions as a source for the controlled release of $P_2O_5$ vapors which are directed to the desired face of the silicon wafer. The reverse side of the silicon wafer receives little or no phosphorus and consequently retains its character as P-type silicon.

18 Claims, 3 Drawing Figures

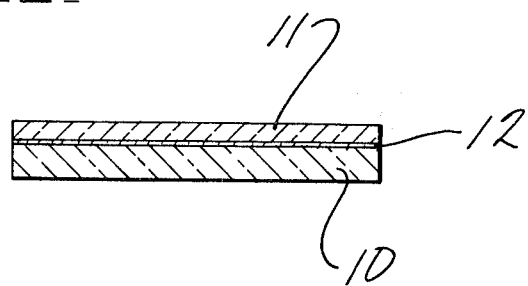
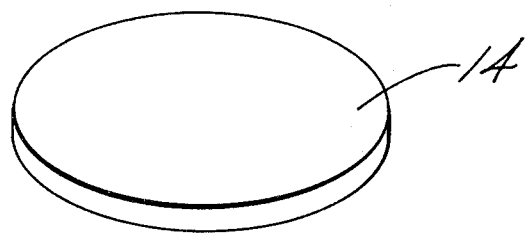
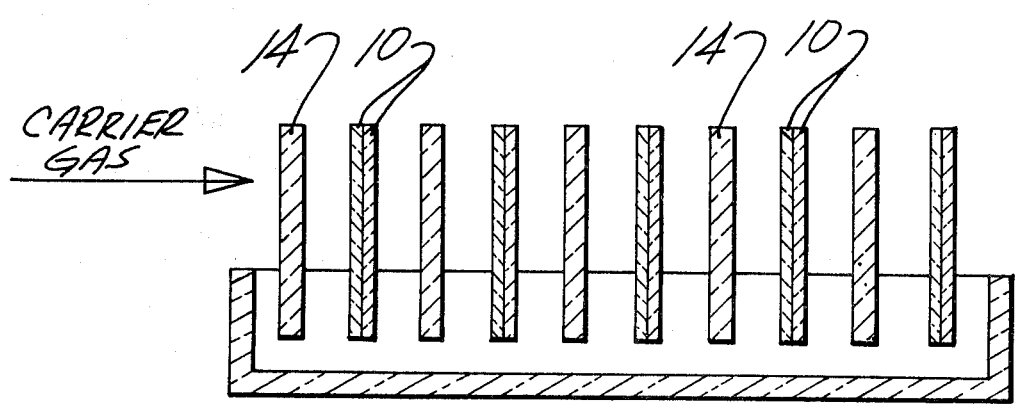

ALUMINUM METAPHOSPHATE DOPANT SOURCES

This is a continuation of application Ser. No. 427,380 filed Dec. 21, 1973 now abandoned, which in turn is a div. of application Ser. No. 305,548, filed Nov. 10, 1972 and issued Oct. 15, 1974 as U.S. Pat. No. 3,841,927.

The present invention relates to diffused junction-type semi-conductor devices, and especially to a new method for diffusing active impurities into semi-conductor materials.

More particularly, the present invention pertains to a more precise and readily controllable method of forming a phosphorus-containing layer in at least a portion of the surface of a silicon semi-conductor for the purpose of creating a P-N junction on a P-type semi-conductor silicon chip or wafer.

BACKGROUND OF THE INVENTION

Semi-conductors have been known in the industry for many years and the term semi-conductor material has been considered generic to a number of materials, including silicon. As used herein, the term is intended to pertain to the silicon elements or "chip" semi-conductor substances. Customarily, these elements are in the form of a wafer or disc. They may be circular, rectangular or triangular or any other convenient shape. Silicon is characterized in an electron energies diagram by a relatively wide gap between the top of its valence band and the bottom of its conduction band. This inherent property of silicon makes possible stable electron operation at relatively high temperature and also results in low reverse currents across a P-N junction region of such a body. As a consequence, silicon shows considerable promise for use in semi-conductor devices, particularly where they are to operate at high temperatures such as when dissipation effects associated with large currents being handled cause appreciable heating of the semi-conductor body or in situations where it is important to have as low reverse currents as possible in the semi-conductor device.

Generally, the silicon element has an active impurity incorporated therein which impurity affects the electrical rectification characteristics of the silicon as distinguished from other impurities which may have no appreciable effect on those characteristics. Active impurities are usually classified as donor impurities or acceptor impurities. The donor impurities are phosphorus, arsenic and antimony and the acceptor impurities are boron, gallium, aluminum and indium.

With respect to the nomenclature used in the semi-conductor art, a region of semi-conductor material containing an excess of donor impurities and yielding an excess of free electrons is considered to be an impurity doped N-type region. On the other hand, an impurity doped P-region is one containing an excess of acceptor impurities resulting in a deficit of electrons or an excess of holes. In other words, an N-type material is one characterized by electron conduction whereas a P-type material is one characterized by hole conduction. When a continuous solid specimen of semi-conductor material has an N-type region adjacent to a P-type region, the boundary between them is termed a P-N or N-P junction and the specimen of semi-conductor material is termed a P-N junction semi-conductor device. The present invention is concerned with a P-type silicon element which has formed thereon a phosphorus-containing layer which is an N-type region. The reverse side of the silicon chip or wafer retains its P-type nature and accordingly, the product produced by this invention is a P-N junction semi-conductor device. Therefore, to make a simplified P-N junction requires the addition of N-type impurity to a surface layer of P-type semi-conductor.

Semi-conductors have application and utility for purposes such as rectifiers, transistors, photodiodes, solar batteries, semi-conductor controlled rectifiers and other devices. In addition to general electronic applications, the P-N junction semi-conductor is frequently used as a radiation detector or charged particle detector. For example, a charged particle such as a proton, alpha, or electron releases some of its energy in passing through the P-N junction, and produces an electrical pulse which is amplified and which is proportional to the energy of the particle. In this particular usage, it is quite important to have a thin uniform P-N junction which is made possible by the present invention. Also, electromagnetic radiation such as visible light or particularly infra red radiation may be detected by its interaction with the P-N junction.

Silicon devices containing a diffused P-N junction have been made by heating P-type silicon chips or wafers in the presence of a phosphorus compound such as phosphorus pentoxide. The phosphorus pentoxide is believed to form a glassy film over the surface of the wafer and subsequently, with continued heating, elemental phosphorus diffuses into the silicon. The phosphorus could also be deposited on the surface of the silicon wafer at a low temperature and then heated to a temperature at which diffusion will take place.

Various developments have taken place in the prior art to effect the doping of the semi-conductor material by the addition of dopant impurities while the silicon crystal is being pulled from a melt or by applying alloying and diffusing methods to a growing crystal. In general, the diffusion of the doping substance into the silicon material is effected by heating a predetermined quantity of the particular substance together with the silicon in a closed receptacle so that the dopant atoms will permeate from all sides into the semi-conductor body. Methods involving deposition of a dopant on a limited surface area of the semi-conductor body are described in U.S. Pat. No. 3,287,187. This prior art method requires the deposition of an oxide of the semi-conductor material by vapor deposition followed by diffusion of the doping substance into the semi-conductor surface area by heating the semi-conductor body.

Another method of diffusing phosphorus oxide into a semi-conductor crystal is shown in U.S. Pat. No. 3,540,91, wherein the source of the phosphorus compound is produced by fusing an alkaline earth phosphate and phosphorus pentoxide. Illustratively, the fusion product of tertiary calcium phosphate and phosphorus pentoxide is used and it is said to yield reproducible results for doping semi-conductor crystals of silicon. However, when a mixture of calcium phosphate and phosphorus pentoxide is used containing appreciable phosphorus pentoxide, the material would be a molten glass or at best a molten mass at normal doping temperatures ranging from 900° C. to 1200° C. This would necessitate containing the phosphate mixtures or salts in a boat or crucible in a temperature zone typically lower than that required for diffusion after the doping process takes place. Two different temperature zones or two different reaction conditions would thereby be involved if this particular prior art method were followed. The requirement for containing molten materials in a boat or crucible drastically reduces the number of silicon chips which can be treated simultaneously in a uniform temperature zone and further complicates the procedures.

Another approach described in the prior art for doping a wafer of semi-conductive silicon involves the use of vapors of ammonium phosphate. U.S. Pat. No. 2,974,073 discloses a method wherein the vapors of ammonium phosphate are employed and is reported to form a glassy phosphorus containing surface film over the wafer. It is said that some phosphorus diffuses from the film into the wafer to form a phosphorus diffused N-type surface on the wafer. Commercially used doping temperatures commonly fall within the range from 900° C. to 1200° C. and at these temperatures, the ammonium phosphate would decompose completely rendering it useful for only a single doping. These properties would necessitate temperature zones typically lower than that required for diffusion after the doping process takes place. The U.S. Pat. No. 2,974,073 shows that a convenient method of forming the step is to utilize a two-zone furnace. The requirement for maintaining two different temperature zones or two different reaction temperatures places an unwanted burden on the commercial practice of this method.

SUMMARY OF THE INVENTION

Applicants' invention overcomes the difficulties and drawbacks of prior art methods utilizing liquid or molten sources of phosphorus oxide and methods requiring a two-zone furnace, two furnaces or two different temperature treatments. The method of this invention depends in principle on a solid, oxidized source of phosphorus for deposition on the silicon surface followed by a subsequent reaction with the silicon at high temperature. This reaction reduces the deposited compound to elemental phosphorus which in turn diffuses to a controlled depth into the wafer. The concentration and the depth of the junction is proportional to the time and temperature of the doping and the diffusing operation. Applicants' invention resides in using a different source of the oxidized phosphorus and a novel method for contacting the hot silicon surface with the phosphorus.

Accordingly, it is an object of the present invention to provide an improved method for diffusing phosphorus into a silicon semi-conductor surface.

It is a further object of the invention to provide a novel source of the phosphorus used for diffusion into the silicon surface.

It is a further object of the present invention to provide a method utilizing a solid source for application of phosphorus pentoxide vapors to a surface of a silicon semi-conductor element.

A still further object of the present invention is to provide a solid source capable of liberating phosphorus pentoxide vapors that can be used more than one time for doping a silicon semi-conductor surface.

The above and other objects and advantages of the present invention will become apparent from the following detailed description thereof taken in conjunction with the drawing wherein:

FIG. 1 is a cross-sectional view of the semi-conductor body, having been processed in accordance with the method described herein.

FIG. 2 is an isometric view of a solid wafer of aluminum metaphosphate as described herein.

FIG. 3 is an elevation view showing a refractory container in which a plurality of solid discs of aluminum metaphosphate and a plurality of silicon wafers are arranged in accordance with the invention.

DETAILED DESCRIPTION OF THE INVENTION

In accordance with one embodiment of the present invention and with reference to the attached drawings, a suitable P-type silicon substrate 10 is prepared by any of the known techniques of obtaining monocrystalline bodies of silicon. For example, a monocrystalline ingot may be formed of highly purified silicon. Then the ingot is cut into transverse slices and the slices are diced to form silicon wafers of the desired dimension. The surface of the substrate may be prepared by suitable cleaning and polishing. However, the polished and cleaned semi-conductive silicon materials may be commercially purchased. Polishing or cleaning of the surface may be accomplished by mechanical means such as lapping or the like or by chemical means, such as etching which is well understood in the art and does not form a part of the present invention.

For conventionally grown crystals, the surface may be chemically polished with a suitable etchant for example a concentrated solution of three parts hydrofluoric acid, three parts acetic acid and five parts nitric acid, by volume. Alternatively, the surface may be prepared by lapping or etching with a hot solution of water containing about 10% sodium hydroxide at ambient temperature and up to about 90° C. These cleaning and etching operations function for the purpose of removing contaminants from the surface and to make the surface uniform with a high degree of smoothness. These preparatory operations are well understood in the art.

The P-type silicon starting material 10 may be doped with any of the known acceptor-type inpurities such as boron, aluminum, gallium, or indium. The impurity concentration in the starting material is primarily determined by the required characteristics in the device to be fabricated.

Formation of P-N junctions of the present invention have been found to occur to a desirable extent on P-type silicon having a resistivity in the range of 13 ohm-centimeters. It is, of course, readily apparent that the precise size and nature of the wafer is not critical. For example, wafers conventionally used may be 1, 2 or 3 inches in diameter or even more. The thickness may range from 5 to 20 mils, although this may vary. Typical wafers are 8 to 10 mils thick. Likewise, the resistivity of suitable P-type silicon starting materials ranges from about 3 to about 15 ohm-centimeters.

An oxide layer 11 is grown on the surface of wafer 10 in accordance with this invention. The wafer is heated in the fumes of $P_2O_5$ so that a film or coating is formed over at least a portion of the surface of the wafer. A mask or protective covering may be utilized so as to develop any pattern as is understood in the art. The coating or film 11 is of glassy nature and its composition may vary somewhat and is believed to be $P_2O_5$. In any event, the film does contain phosphorus in one form or another. The temperature of this operation is such that simultaneously, some phosphorus diffuses from the film or deposit 11 into the wafer 10 forming a thin phosphorus diffused surface layer or region 12 adjacent the coating 11. The region 12 is a barrier or boundary formed at the interface between the phosphorus diffused surface layer 11 and the P-conductivity silicon 10. The juncture depth may vary, but in general, it is up to about 10 microns in thickness. The minimum thickness can vary and illustratively is about 0.1 micron.

FIG. 2 shows a disc or wafer of high purity aluminum metaphosphate, $Al(PO_3)_3$, which functions as the source of phosphorus pentoxide vapors for contact with the silicon wafers. The wafer or disc of high purity aluminum metaphosphate can be produced in a number of ways. It may be produced from metal organic derived materials as described in the application of Ian M. Thomas Ser. No. 305,342, and now abandoned, or it may be produced as a glass or converted to a glass-ceramic. Illustratively, the wafer 14 may be produced by sintering and/or by hot pressing high-purity aluminum metaphosphate into a porous disc of the size and shape suitable for completely coating a P-type silicon chip of semi-conductor grade with a layer of phosphorus pentoxide. The aluminum metaphosphate may be cold pressed and then sintered at elevated temperature or it may be hot pressed, i.e., sintered under heat and pressure. Conditions of hot pressing can vary and are known in the art. When positioned in a suitable furnace used for the invention, and when subjected to temperatures in the range of 700° C. to 1200° C., more particularly 900° C. to 1150° C., the aluminum metaphosphate wafer liberates $P_2O_5$ vapors which vapors then flow through the furnace high temperature zone in the direction of contacting the silicon wafers positioned in the vicinity of the aluminum metaphosphate wafer. Generally, the method comprises diffusing phosphorus into a semi-conductor silicon element by positioning at least one semi-conductor silicon element in a furnace, positioning a solid aluminum metaphosphate wafer, disc or similar body in the furnace in the vicinity of, but not in physical contact with the silicon element, and then subjecting the silicon element and solid aluminum metaphosphate body to an elevated temperature in the range of 700° C. to 1200° C. At these temperatures the aluminum metaphosphate body liberates $P_2O_5$ vapors which vapors then pass through the furnace and contact at least a portion of the surface of the silicon element. This process is conducted for a sufficient period of time to permit the diffusion of the phosphorus into at least one portion of the surface of the silicon element to form a diffused region therein.

After the $P_2O_5$ vapors react with the hot silicon surface, the elemental phosphorus diffuses into the silicon chip with continued heating. The controlled release of $P_2O_5$ vapors occurs according to the formula:

This reaction may also be expressed as follows:

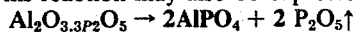

The rate of release is a function of the temperature and pressure. Illustratively, about 50% of the total weight of the $Al(PO_3)_3$ is lost during a period of a few hundred hours at 950° C. to 1100° C., a typical particular range of doping temperature used in the semi-conductor industry. The rate of release of $P_2O_5$ vapors appears to be a linear function after an initial one hour soak with a lower rate at lower temperatures and a higher rate at higher temperatures and/or reduced pressures. The reaction of the $P_2O_5$ vapors at the silicon surface may be represented by the following equation:

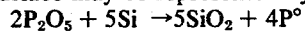

As a further aspect to this embodiment of the invention, the doping process is further controlled and enhanced by the use of free-flowing inert carrier gas such as argon, or nitrogen, where the flow is in the direction from the solid state doping source wafer 14 toward the desired doped face of the silicon chip. As used here, the expression "inert gas" means that the carrier gas does not enter into the chemical reaction between the $P_2O_5$ vapors and the hot silicon surface. This is shown in FIG. 3, wherein the carrier gas enters from the left and passes across wafer 14 where the $P_2O_5$ is released and contacts the exposed surfaces of the silicon wafer 10. By placing two silicon wafers back to back, the reverse side of each of the silicon chips receives no phosphorus from the process and consequently retains its original character as a P-type silicon. Following the doping process, the diffusion depth can be further increased to bury the junction deeper by a simple heat treatment in an inert atmosphere. This may be carried out in a separate furnace if desired.

In a further embodiment, wafer 14 may be produced in the form of a glass or glass-ceramic material. According to this embodiment of the invention, suitable compositions containing appropriate raw materials can be melted to form a homogeneous glass. Illustratively, compositions containing 70 to 81% $P_2O_5$, preferably 74 to 81%, and 19-30% $Al_2O_3$ (by weight) can be melted to form a homogeneous glass at 1500° C. in a fused silica or slip cast fused silica crucible. Generally, this melting procedure requires about 15 to 30 minutes. It may be desirable to add additional $P_2O_5$ to the melt to account for losses due to volatilization. It is desirable to keep the melting time as short as possible in order to reduce the losses due to volatilization. Also, the batch material should be as pure as possible so as to minimize the presence of impurities. Accordingly, chemically pure grade reagents may be used for this purpose. Also, starting materials made by the metal organic derivative method of Thomas may also be used. A short melting time also lowers the amount of silica dissolved from the crucible to less than about 1% as shown by X-ray fluorescence analysis of the finished glass. Generally, up to about 5% other ingredients, viz. glass forming ingredients or modifying oxides, can be added either as deliberate ingredients or as impurities in the batch materials without deleterious results, although these ingredients should be kept at a minimum. Greater than about 5% of these substances may cause difficulties in the diffusion operation. Nucleating agents such as $ZrO_2$ or $TiO_2$ may be added in like amount but in amounts of 5% or more, crystallization appears to be inhibited and interferes with the desirable functioning of the material.

The most important consideration is that the glass or the glass-ceramic be free of impurities which exhibit high vapor pressures at 900° C. to 1200° C. Clearly, the presence of impurities may deleteriously affect the electrical performance of the doped silicon device. Impurities specifically to be excluded or held at an absolute minimum are the oxides of the alkalis, i.e., $Li_2O$, $Na_2O$, $K_2O$, $CS_2O$ or $Rb_2O$ and the oxides of heavy metals, such as lead: Therefore, it is desirable to use high purity materials, either chemically pure substances, extremely pure batch ingredients or the high purity batches prepared by the metal organic method as described in the above mentioned application of Ian M. Thomas,.

After the glass compositions are melted and formed into a homogeneous molten mass, the glasses may be cast into any desired shape. Conveniently, this can be carried out by casting the glass into preheated graphite molds in the shape of right circular cylinders of a diameter approximating that of the finished diffusion disc. The mold containing the glass casting may be transferred directly to an annealing furnace operating in a temperature range from illustratively, about 650° C. to about 750° C. depending upon the composition.

After about 15 minutes at a temperature within the annealing range, the glass is permitted to cool and when cold the glass billet or cylinder is removed and inspected for flaws and then sliced into wafers ranging from 0.025 inches to 0.050 inches in thickness. At this point, the glass wafer can be used in the form of a glass or it may be converted to a glass-ceramic. When the solid aluminum metaphosphate is in the form of a glass, the elevated temperature used in the furnace is from about 700° C. to a temperature less than the softening point temperature of the glass, generally this will be about 800° C.

If desired, the glass can then be heat-treated to form a predominantly crystalline body with the major crystalline phase constituting aluminum metaphosphate, $Al(PO_3)_3$, by holding the respective wafers or discs at a temperature between the annealing point and the fiber softening point of the glass for a period of one up to two hours followed by a slow temperature rise of about 5° C. per minute to a temperature near the crystallization exotherm as shown by Differential Thermal Analysis. After 1 to 2 hours at this temperature, the furnace temperature is increased to 1100° C. to complete the crystallization.

The fiber softening point in general is in the range of about 875° to about 900° C.

Crystallization temperature is typically about 1000° C. to 1100° C. The duration of the crystallization time will range from one to three hours. Thereafter, the glass-ceramic material may be slowly cooled in the furnace.

The crystallization heat treatment is actually an extremely important aspect of the process since a delicate balance exists between the onset of crystallization and the softening of the patent glass. The $P_2O_5$ in the aluminum metaphosphate crystals which form exhibits an appreciable vapor pressure at the temperature of crystallization. Thus, if the glass becomes too soft during the process, the trapped vapors create bubbles which cause the sample to bloat and occasionally rupture. Accordingly, careful control of the heat treatment is necessary to avoid this condition. Following the completion of the crystallization, the crystalline wafers can be reheated for long periods of time at temperatures as high as 1150° C. or 1200° C. without fear of deformation or breaking except for extreme thermal shock in the cooling cycle. However, as a precautionary measure, these wafers should be carefully handled during all phases of the operation.

When the glass-ceramic wafers are employed as the source of $P_2O_5$, they are placed in a suitable furnace together with the silicon wafers and the temperature is raised to the range of 700° C. to 1200° C., preferably 900° C. to 1150° C. Under these conditions, the glass-ceramic wafers exhibit a vapor pressure caused by volatilization of $P_2O_5$ which is a function of the temperature. Under typical diffusion conditions, a temperature will be selected in the range of 1100° C. to 1150° C. and a loss of weight of the glass-ceramic chip occurs equivalent to the evolution of $10^{19}$ to $10^{20}$ phosphorus atoms per hour. This rate is very reproducible and is ideally suited for maintaining extremely close control over the diffusion doping process of silicon semi-conductor wafers. Because of the very close control made possible by the present invention, a plurality of silicon elements may be treated by appropriate positioning of a plurality of aluminum metaphosphate wafers arranged in a boat as shown in FIG. 3.

In carrying out this aspect of the invention, the doping is accomplished by placing the glass-ceramic chips near and parallel to but not touching the silicon wafer to be doped. Generally, for best results, the distance has been determined to be about one-eighth inch. In a multi-slotted fused silica boat or other refractory vessel, container or the like, as many as 100 or more silicon chips or wafers can be doped to a uniform level simultaneously by spacing, alternately a glass-ceramic chip, two silicon chips back to back, a glass-ceramic chip, etc. The general arrangement may be as shown in FIG. 3. It will be apparent that this same arrangement may be utilized when the aluminum metaphosphate is a glass wafer or a sintered or hot pressed wafer.

Time and temperature of doping conditions are selected to give the appropriate P-N junction depth and sheet resistivity for the desired device configuration. This is shown in Table 2 below.

Spacing of the chips in the boat and selection of ambient inert carrier gas and the flow rate are based on requirements that silicon chips facing in the direction of the ambient gas flow receive equivalent doping to those facing counter to the flow. Optimum conditions can be determined by studies such as presented by David Bunning Rupprecht of the Graduate School of Pennsylvania State University, Department of Electrical Engineering, entitled "The Use of 93% Boron Nitride Hot Pressed Wafers as a Boron Diffusion Source for Silicon Solid State Diffusion", a Thesis in Electrical Engineering submitted in partial fulfillment of requirements for the degree of Master of Science, June 1972.

Table 1 presents compositions, glass properties and preferred heat treatment schedule while Table 2 shows effects of time and temperature of doping on sheet resistivity of doped silicon semi-conductor wafers.

TABLE 1

| GLASS NO. | 1 | 2 | 3 |
|---|---|---|---|
| %$SiO_2$ | 0.44 | 0.40 | 0.45 |
| %$P_2O_5$ | 78.4 (80.7) | 69.5 (74.6) | (74.5) |
| %$Al_2O_3$ | 21.0 (19.3) | 30.0 (25.4) | (25.0) |
| Anneal. Pt. | 677° C. | 744° C. | 690° C. |
| Fiber Soft. Pt. | 882° C. | 894° C. | 902° C. |
| DTA-XTAL Peak | 994° C. | 973° C. | 1024° C. |
| Heat Treatment | 800° C.–2 hrs. 990° C.–2 hrs. 1100° C.–1 hr. | 800° C.–2 hrs. 960° C.–2 hrs. 1100° C.–1 hr. | 800° C.–2 hrs. 1000° C.–2 hrs. 1100° C.–1 hr. |

Note: Values in parentheses are theoretical.

TABLE 2

Sheet Resistivity in ohms/square, Effect of Diffusion Time & Temperature. Glass-Ceramic Chip from Glass No. 2, (Table 1) 13 ohm-cm "p" Type Chips, Spacing 1/8", Ambient-Argon 250 cc/min.

| | 30 min. | 1 hr. | 2 hrs. | 4 hrs. | 16 hrs. |
|---|---|---|---|---|---|
| 950° C. | 40.7 | 20.9 | 11.2 | 7.4 | 3.6 |
| 1000° C. | 10.8 | | | | |
| 1100° C. | 3.6 | 2.2 | 1.4 | 0.9 | 0.5 |
| 1150° C. | 2.7 | | | | |

To provide the required higher degree of control of the proportion of the phosphorus doping impurity contacting the silicon wafer, essentially inert diluent carrier gas should be used such as nitrogen, argon, helium and the like. Both the flow rate and the amount of the phosphorus doping constituent can be varied so as to form a uniform diffusion gas mainstream.

The mixture of the gas and the phosphorus doping ingredient is brought into contact with the silicon wafer in the boat while it is at an elevated temperature and peferably the temperature between 900° C. and 1200° C. The flow rate of the diffusion gas stream over the crystal element is advantageously between about 20 to 500 cc/min. (Room temperature measure) and is adjusted so that the chip facing in the direction of flow receives doping equivalent to chips facing counter to the flow and is dependent on the silicon chip to dopant distance.

In summary then, the present invention provides the means for doping P-type silicon semi-conductor wafers or chips with phosphorus from a solid aluminum metasphosphate source in an extremely uniform reproducible and predictable manner. While other inorganic materials may be added to the aluminum metaphosphate to improve sinterability, strength and other factors, limiting this is the fact that such additives must exhibit extremely low or no alien vapor pressure at the temperatures used for doping; e.g., 1150° C. and must not decrease the mechanical stability of the dopant chip at the elevated temperatures utilized in the process. That is, the chip must not melt, warp or sag at that temperature.

As for the degree of doping of the silicon semiconductor, this is dependent only upon time, temperature and solubility of the phosphorus at the silicon surface. All compositions tested gave off more than enough phosphorus to satisfy chip requirements but not enough to damage chip surface in any way. Selected additives such as silica, serve to decrease the decomposition rate of the aluminum metaphosphate and thereby increase the life expectancy of the dopant chips to several hundred hours at doping temperatures provided proper caution is exercised in the handling of the dopant chips. The use of the solid aluminum metaphosphate source in accordance with the present invention represents an advance with respect to the prior art because it permits high production rates with precise control over uniformity of the final products.

The phosphosilicate glass that is formed on the surface of the silicon chip is easily removed by hydrofluoric acid and can be dissolved independently of outside layers used for masking purposes. For example, 10 seconds immersion at room temperature in a solution consisting of 300 parts distilled water, 15 parts hydrofluoric acid and 10 parts nitric acid will remove layers formed by standard time at maximum temperature treatment.

The following table (Table 3) shows the effect of temperature on the sheet resistance. It will be noted that the units of the sheet resistance are expressed as "ohms per square". This is based on the formula for resistivity which is set forth below:

$$R = \rho \frac{l}{A}$$

wherein R is the resistance of a uniform conductor, 1 is its length, A is its cross-sectional area and $\rho$ is its resistivity. Resistivity is usually expressed in "ohm-centimeters".

TABLE 3

Time: 1/2 hour
Carrier Gas: Argon 250 cc/min.
Chip to Dopant Spacing: 1/8"
Original Silicon Resistivity: 13 ohm cm. "P" Type

| CHIP NO. | TEMP. | SHEET RESISTANCE | JUNCTION DEPTH |
|---|---|---|---|
| 1 | 950° C. | 39Ω/square | 0.5μ (approx.) |
| 2 | 1000° C. | 13.9Ω/square | — |
| 3 | 1050° C. | 6.9Ω/square | — |
| 4 | 1100° C. | 2.66Ω/square | 4.5μ |
| 5 | 1100° C.* | 2.44Ω/square | — |
| 6 | 1150° C. | 1.65Ω/square | — |

*Additional 10 min. at 1050° C. after original doping.

It is claimed:
1. A sintered and porous body consisting essentially of aluminum metaphosphate.
2. The sintered and porous body as defined in claim 14 shaped in the form of a thin wafer.
3. A wafer consisting essentially of aluminum metaphosphate.
4. A wafer according to claim 3 which contains a small amount of silica.
5. A wafer formed of a composition consisting essentially of 70 to 81% $P_2O_5$ and 19–30% $Al_2O_3$, by weight.
6. A wafer according to claim 5 which is a glass wafer.
7. A wafer according to claim 5 which is a glass-ceramic.
8. A dopant source for vapor phase diffusion of oxidized phosphorus which is a sintered and porous thin wafer consisting essentially of aluminum metaphosphate.
9. A dopant source as defined in claim 8 which contains a small amount of silica.
10. A dopant source for vapor phase diffusion of oxidized phosphorus which is a wafer formed of a composition consisting essentially of 70 to 81% $P_2O_5$ and 19–30% $Al_2O_3$ by weight, which is either a glass or a glass-ceramic.
11. A dopant source as defined in claim 10 which is a glass wafer.
12. A dopant source as defined in claim 10 which is a glass ceramic.
13. A dopant source for vapor phase diffusion of oxidized phosphorus which is a sintered and porous body consisting essentially of aluminum metaphosphate.
14. A dopant source for vapor phase diffusion of oxidized phosphorus in the form of a wafer consisting essentially of aluminum metaphosphate.
15. A dopant source as defined in claim 14 which contains a small amount of silica.
16. A dopant source for vapor phase diffusion of oxidized phosphorus which is a wafer formed of a composition consisting essentially of 70–81% $P_2O_5$ and 19–30% $Al_2O_3$ by weight.
17. A dopant source as defined in claim 16 which is a glass wafer.
18. A dopant source as defined in claim 16 which is a glass ceramic.

* * * * *

UNITED STATES PATENT AND TRADEMARK OFFICE
CERTIFICATE OF CORRECTION

PATENT NO. : 3,998,668
DATED : December 21, 1976
INVENTOR(S) : Jack M. Florence; William E. Smith It is certified that error appears in the above-identified patent and that said Letters Patent are hereby corrected as shown below:

Col. 10, Claim 2, "14" should be --- 1 ---.

Signed and Sealed this

Twenty-ninth Day of March 1977

[SEAL]

Attest:

RUTH C. MASON
Attesting Officer

C. MARSHALL DANN
Commissioner of Patents and Trademarks

UNITED STATES PATENT OFFICE
CERTIFICATE OF CORRECTION

Patent No. 3,998,668  Dated December 21, 1976

Inventor(s) Jack M. Florence et al.

It is certified that error appears in the above-identified patent and that said Letters Patent are hereby corrected as shown below:

Claim 2 should read as follows:

2. The sintered and porous body as defined in claim 1 shaped in the form of a thin wafer.

Signed and Sealed this

Tenth Day of May 1977

[SEAL]

Attest:

RUTH C. MASON
*Attesting Officer*

C. MARSHALL DANN
*Commissioner of Patents and Trademarks*